United States Patent [19]
Tsukada

[11] Patent Number: 5,488,200
[45] Date of Patent: Jan. 30, 1996

[54] INTERCONNECT STRUCTURE WITH REPLACED SEMICONDUCTOR CHIPS

[75] Inventor: Yutaka Tsukada, Shiga, Japan

[73] Assignee: International Business Machines Corporation, Armonk, N.Y.

[21] Appl. No.: 255,596

[22] Filed: Jun. 8, 1994

Related U.S. Application Data

[62] Division of Ser. No. 976,619, Nov. 16, 1992, Pat. No. 5,355,580.

[30] Foreign Application Priority Data

Dec. 26, 1991 [JP] Japan ................... 3-3448221

[51] Int. Cl.⁶ ....................... H05K 1/18
[52] U.S. Cl. .............. 174/261; 174/260; 361/760; 361/767; 361/765; 439/68
[58] Field of Search ................... 174/250, 260, 174/261; 439/68, 71; 29/840, 841; 361/760, 765, 767, 768, 769, 770

[56] References Cited

U.S. PATENT DOCUMENTS

| | | | |
|---|---|---|---|
| 4,942,140 | 7/1990 | Ootsuki et al. | 437/211 |
| 5,233,504 | 8/1993 | Melton et al. | 361/760 |
| 5,250,848 | 10/1993 | Christie et al. | 257/778 |
| 5,329,423 | 6/1994 | Scholz | 361/760 |

FOREIGN PATENT DOCUMENTS

| | | |
|---|---|---|
| 58-48932 | 3/1983 | Japan. |
| 62-276837 | 12/1987 | Japan. |

*Primary Examiner*—Laura Thomas
*Attorney, Agent, or Firm*—Michael E. Belk

[57] ABSTRACT

A face-down bonded semiconductor chip 4 encapsulated with a resin 14 is removed from the substrate 2 with a cutting end mill 26. The resin 14 and bump electrodes 6 remaining on the substrate 2 are then cut with a finishing end mill to a height of about one half of the original height to planarize the surface. Another chip 4A having bump electrodes 6A is aligned with the bump electrodes 6 on the substrate 2, and bonded face down on the substrate. Finally, resin 14A is flowed into the gap between the chip 4A and the substrate 2 and around the chip 4A to encapsulate the chip.

30 Claims, 3 Drawing Sheets

INTERCONNECT STRUCTURE WITH REPLACED SEMICONDUCTOR CHIPS

This is a divisional of copending application(s) Ser. No. 07/976,619 filed on Nov. 16, 1992, now U.S. Pat. No. 5,355,580.

FIELD OF THE INVENTION

This invention relates to methods for replacing a semiconductor chip bonded face down to a substrate and encapsulated by a resin and the resulting circuit boards.

BACKGROUND

In the direct chip attachment (DCA) packaging systems, chips must be replaced if defective chips are found after bonding semiconductor chips on a circuit substrate, or in the case of an engineering change (EC). When chips are face-down bonded using solder bumps and are not resin-encapsulated, the chips may be removed with ease from the substrate by heating the chips to melt the solder bumps.

As shown in FIG. 1, however, when the space between the substrate 2 and the bottom surface of the chip 4 is filled with a resin such as epoxy resin to encapsulate the chip, problems arise. That is, the resin adheres to the chip 4 and the substrate 2, and thus the chip and the resin cannot be removed with ease. If one attempts to forcedly remove the chip and the resin, the substrate or the circuit on the substrate may be damaged and cannot be reused.

Japanese Published Unexamined Patent Application (Patent Kokai) 58-48932 discloses a technique to facilitate the replacement of resin-encapsulated chips in which the surface of a substrate such as glass is coated with a layer of a material such as a silicone resin which does not adhere well to the encapsulation resin in order to prevent the adhesion of the encapsulation resin to the substrate. Chip bumps are connected to electrode pads on the substrate through openings in the resin layer. However, due to weak adhesion between the encapsulation resin and the substrate, this method involves some problems such as insufficient encapsulation and poor mechanical strength of the bond between the chips and the substrate.

Alternatively, a method can be considered in which an encapsulation resin is treated with chemicals such as a solvent to dissolve or decompose it. However, this method has various problems. First, the substrate and components may be affected adversely by the chemicals. Also, in order to subject only a selected chip to the chemical treatment, the chips must be mounted spaced apart from each other by a required distance, and thus the chip density is limited. Furthermore, since the distance between the chip and the substrate is as small as, for example, 0.1 mm, it is difficult to remove the resin by introducing the chemicals into this space, increasing treatment time.

Furthermore, when a chip bonded face down by bump electrodes such as solder bumps is removed, the bump electrodes are destroyed. In replacing a chip, therefore, proper bump connections must be reconstructed. Also, when a resin encapsulated chip is removed, the resin encapsulation is also damaged and thus it must be done again. These operations must be easily performed, and the reliability of the replacement chip must be maintained.

SUMMARY OF THE INVENTION

Therefore, it is an object of this invention to provide a method for replacing a semiconductor chip, which is capable of replacing a chip relatively easily without causing mechanical and chemical damages to the substrate or circuits and components formed on the substrate and still capable of maintaining the reliability of the new chip even after the replacement.

The method of this invention is based on the idea of intentionally leaving on the substrate a part of the encapsulation resin and a part of the bump electrodes enclosed in the resin, instead of forcedly peeling or removing all the encapsulation-resin of a semiconductor chip to be replaced. The encapsulation resin and the bump electrodes are left in the form of a mesa-like base or pedestal to minimize the damage on the substrate side and to help maintain reliability after replacement, and then another chip is bonded on the base.

According to this invention, a chip is first mechanically removed from the substrate. Preferably, this is performed by milling. Then, the encapsulation resin and the bump electrodes enclosed therein are out or ground to a predetermined height to planarize their surface. It is preferred that this cutting is also performed by milling. Then, another chip is bonded to the flattened remains of the original bump electrodes on the substrate through the use of a new set of other bump electrodes. Finally, the space between the bottom surface of the chip and the substrate is filled with a resin.

DESCRIPTION OF THE LABELS IN THE DRAWINGS

| | |
|---|---|
| 2 | Substrate |
| 4, 4A | Chip |
| 6, 6A | High Melting point solder bump |
| 8 | Wiring conductor |
| 10 | Epoxy resin layer |
| 12 | Opening |
| 14, 14A | Encapsulation resin |
| 16 | Low melting point solder |
| 18 | Dispensing needle |
| 20 | Router |
| 22 | X-Y stage |
| 24 | Spindle |
| 26 | End mill |
| 28 | Control/drive unit |

DETAILED DESCRIPTION OF THE DRAWINGS

Figure 1:
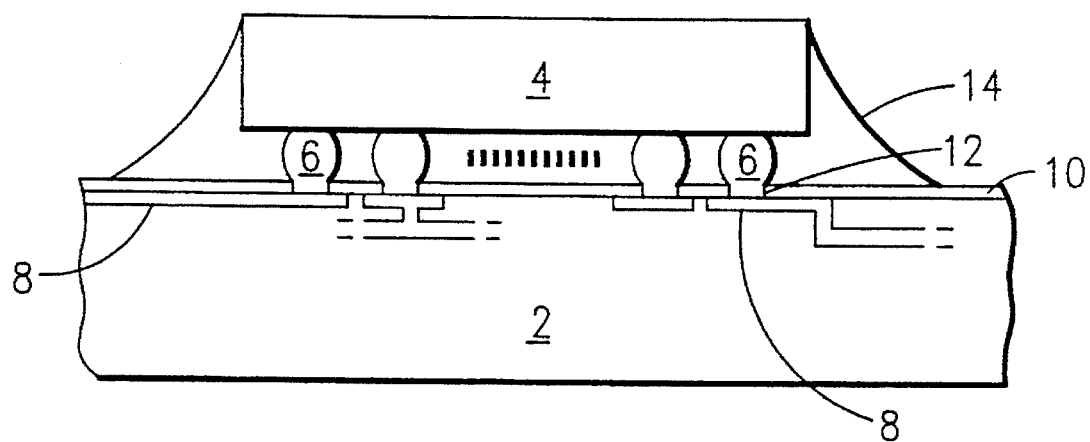
FIG. 1 shows a face-down bonded and resin encapsulated chip.

Referring now to drawings, a preferred embodiment of this invention is described. FIG. 1–FIG. 5 illustrates the steps for replacing a chip according to this invention. FIG. 1 shows an example of a resin-encapsulated semiconductor chip 4 to be replaced. In this embodiment, the chip 4 is bonded face down to a printed circuit substrate 2 by bump electrodes 6 formed of solder. The substrate 2 may be any known substrate. In this embodiment, it is an epoxy impregnated fiber glass substrate. The solder bumps 6 are made of a high melting point solder consisting of, for example, 3–5% tin and 95–97% lead. In this embodiment, it is a solder with a melting point of 325° C. consisting of 3% tin and 97% lead. Wiring conductors 8 are formed on the surface of the substrate 2. The wiring conductors 8 are coated with a photosensitive epoxy resin layer 10 in which openings 12 for exposing the bump connection regions are formed. The solder bumps 6 are connected to the wiring conductors 8 through the openings 12.

The chip 4 is spaced from the surface of the substrate 2 by the height of the solder bumps 6. The distance between the bottom surface of the chip 4 and the top surface of the substrate 2 is about 0.1 mm. The chip 4 is encapsulated by a thermosetting resin 14. The resin 14 may be, for example, a liquid bisphenol-A type epoxy resin marketed by Matsushita Electric Works, Ltd., under the trade name of CV5183 and CV5183S. Such an epoxy resin has a glass transition temperature of 127° C., and a coefficient of thermal expansion of 45 ppm. The resin 14 fills the space between the chip 4 and the substrate 2. The epoxy resin bonds the chip 4 to the resin layer 10 on the surface of the substrate 2, and at the same time, seals the periphery of the chip 4.

Figure 2:
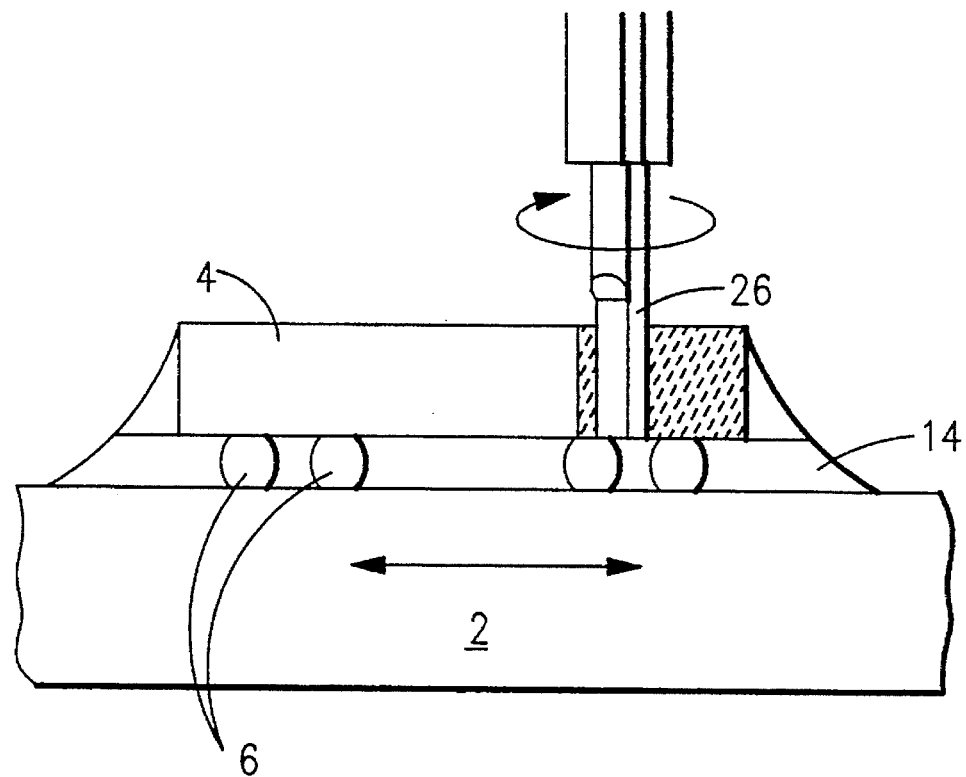
FIG. 2 shows the milling of the semiconductor chip for removing the chip in the invention.

When a defective chip is replaced, or when an engineering change (EC) is carried out, the chip must first be removed. The removal of the chip 4 from the substrate 2 is preferably performed by mechanically cutting the chip 4 by milling as shown in FIG. 2.

Figure 6:
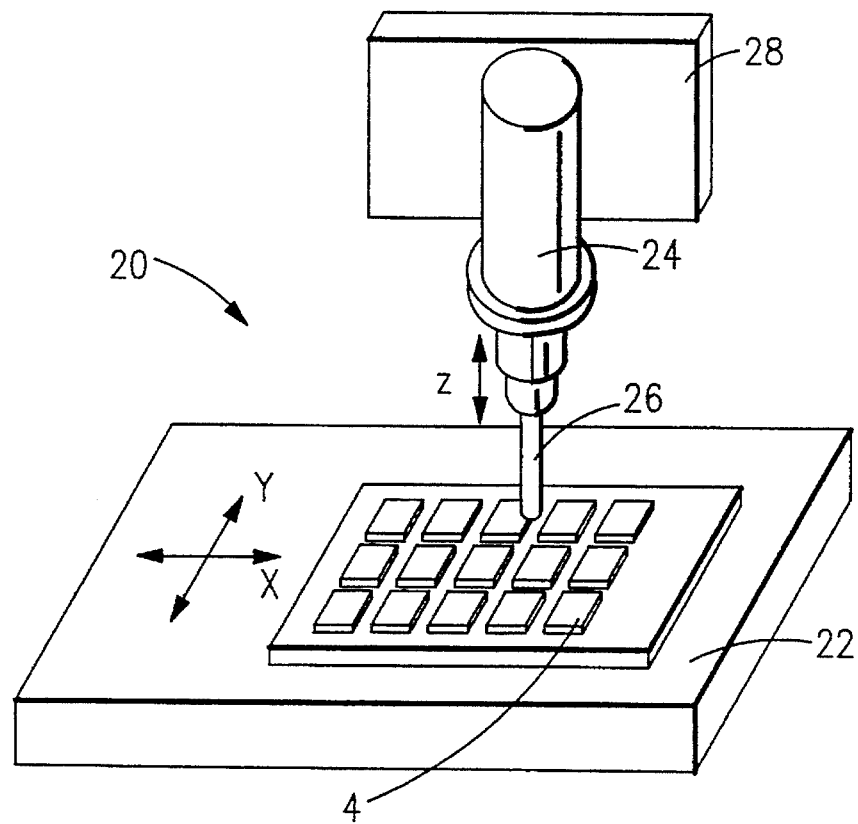
FIG. 6 shows the milling of the invention.

FIG. 6 shows an outline of the milling operation. The substrate 2 on which chips 4 are mounted is placed on the X-Y stage 22 of a machining router 20 (a PHR Series router marketed by Rokuroku Sangyo Co., Ltd., Shizuoka, Japan), and held on the stage 22 by vacuum. An end mill 26 is attached at the end of the spindle 24. As the end mill 26, an RTZ Series half-moon type diamond cutter with a diameter of 1.1 mm, manufactured by Union Tool Co., Ltd., Tokyo, Japan, was used. The cutter is substantially semicircular in cross-section, and diamond abrasive grains are implanted in its tip and side. On cutting, the X-Y stage 22 is controlled to locate the end mill 26 close to the chip 4 to be removed. The position of the spindle 24 in the Z direction is adjusted by a control/drive unit 28 so that the bottom end of the end mill 26 is at almost the same level as the bottom surface of the chip. The X-Y stage 22 is reciprocated while rotating the end mill 26 at high speed to cut the chip 4.

The chip cutting is continued until the chip is completely removed. It has been found that milling can be used effectively for the removal of the chip. The substrate was not damaged by mechanical impact or vibration due to milling since the encapsulation resin 14 strongly adheres to the surface of the substrate and the entire solder bumps 6 are firmly held by the encapsulation resin 14. With the milling, a chip 12 mm×12 mm×0.8 mm in size could be removed in about 90 seconds.

Alternatively, the chip may be removed by heating. In this case, the substrate is placed in an oven and heated to a temperature higher than the glass transition temperature of the encapsulation resin to soften the resin. Since the glass transition temperature of the epoxy resin used is 127° C., the substrate is heated to, for example, 140° C. A scriber is inserted under the chip to peel the chip. Since the adhesion strength of the epoxy resin to the chip is not high, the chip may be removed. Another method is to hold the chip with a gripper after heating and to rotate the chip. However, the scriber and chip rotation methods may damage the resin and solder bumps left on the substrate. If the entire surface of the chip is encapsulated, these methods are difficult to use. Therefore, milling is preferable for removing the chip.

Figure 3:
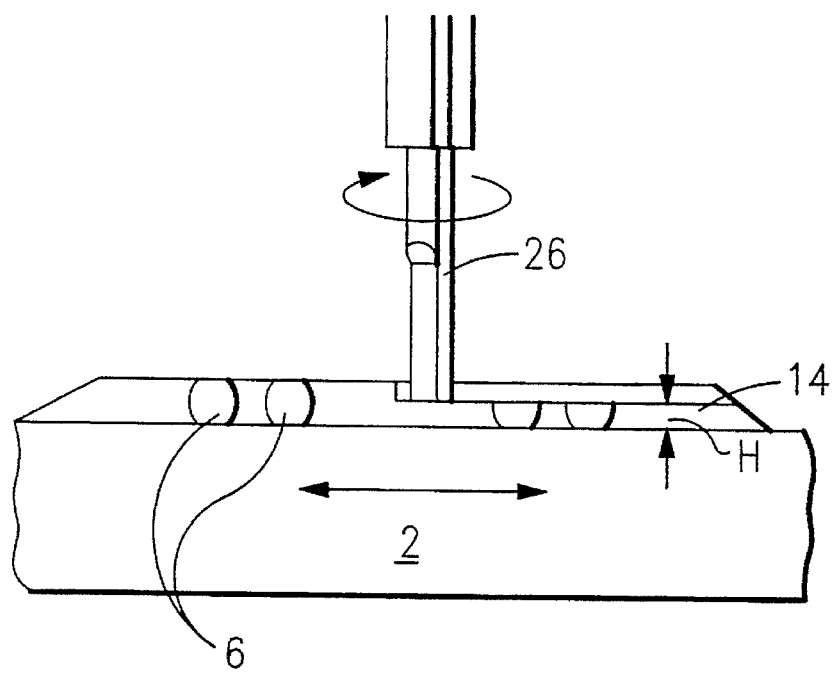
FIG. 3 shows planarizing the surface by cutting the resin layer and solder bumps by milling in the invention after removing the chip.

The next step is, as FIG. 3 shows, to planarize the surface by mechanically removing upper portions of the resin layer 14 and the solder bumps 6 remaining on the substrate. This may be performed by cutting or grinding the surface of the resin using a finishing end mill instead of the-end mill for chip cutting described above. As this finishing end mill, an SM Series half-moon type carbide cutter with a diameter of 1.0 mm, manufactured by Union Tool Co., Ltd., Tokyo, Japan, was used. The height of the remaining resin layer and solder bumps, H, is preferably about 50% or more of the original height of the solder bumps that is the distance between the substrate 2 and the bottom surface of the chip. If the resin layer is cut too deeply, the solder bump holding force of the resin layer is weakened, resulting in peeling off of the solder during the milling and accompanying damage of the underlying electrode pads. It is preferred, therefore, that the cutting is performed so that a half or more of the height of the solder bumps is left. Although there is no upper limit in the height of the remaining resin layer and solder bumps if the cut surface is flat, the height is normally about 70% of the original height of the solder bumps. After the resin is cut, the substrate is cleaned with water.

Next, a low melting point solder is deposited on the solder bumps left on the substrate. This low melting point solder is, for example, an eutectic solder formed of 63% tin and 37% lead. The deposition of the low melting point solder may be performed by any suitable method such as transferring the solder formed on a carrier by electroplating onto the substrate, or extruding molten solder from a nozzle onto the substrate. The low melting point solder may be deposited on either one or both of the high melting point solder bumps of a new chip to be mounted, and the solder bumps remaining on the substrate. Of course, any suitable solder may be used as the high melting point and low melting point solders.

Figure 4:
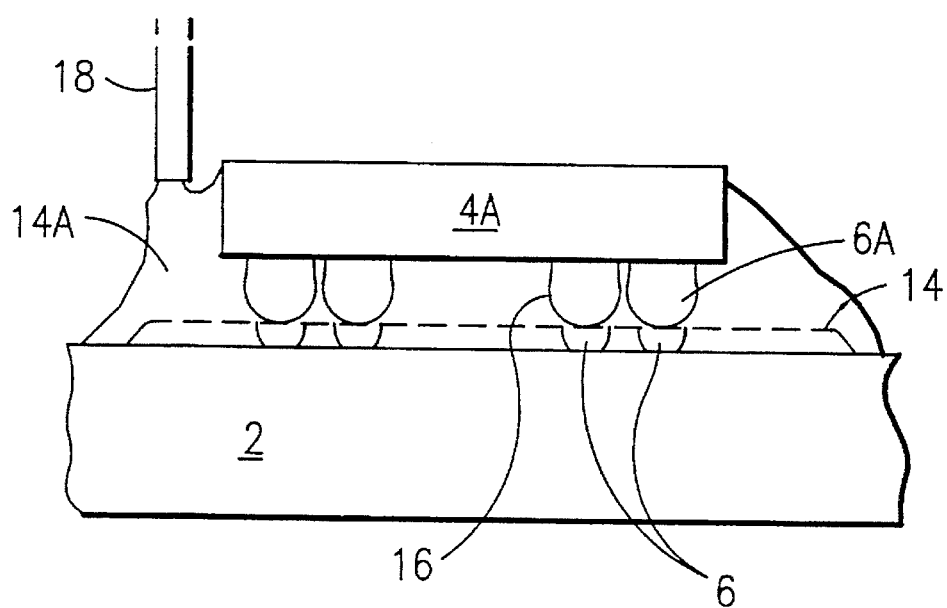
FIG. 4 shows encapsulation with resin in the invention after replacing the chip.

Next, a new chip is positioned so that the solder bumps of the chip are aligned with the solder bumps on the substrate. The substrate is heated to a temperature higher than the melting point of the low melting solder but lower than the melting point of the high melting solder to reflow the low melting solder. Thus, the new chip is bonded face down on the substrate. In FIG. 4, the high melting point solder bumps 6A of a new chip 4A is bonded to the hemispherical high melting point solder bumps 6 with the low melting solder 16.

Figure 5:
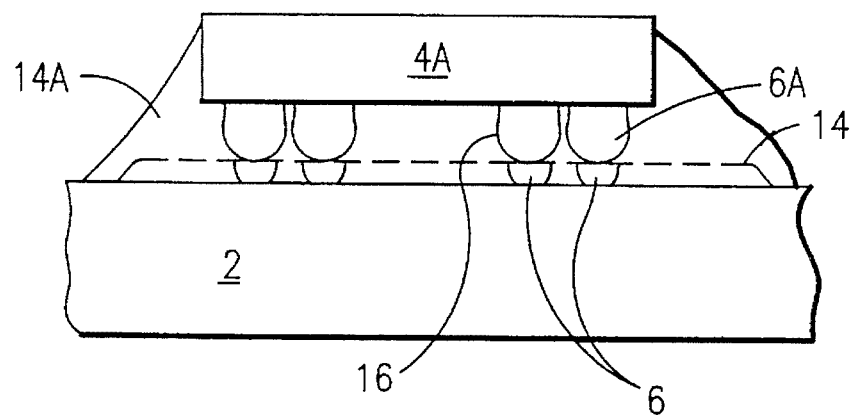
FIG. 5 shows the final structure of the invention after replacing the chip.

Finally, as FIG. 4 shows, the dispensing needle 18 of a commercially available resin dispenser is moved along the edge of the chip to allow the epoxy resin 14A described above to penetrate between the bottom surface of the chip and the substrate by capillary action, and at the same time, the periphery of the chip is coated with the resin. After supplying a predetermined amount of the resin, the substrate was heated in an oven at a temperature of 120° C. for 2 and half hours to cure the resin. This results in the final structure as shown in FIG. 5.

Although a particular embodiment has been described herein, this invention is not limited thereto. For example, although a high melting point solder was used as the bump electrodes, gold bumps or gold-coated copper bumps may also be used. Also, although a vertical end mill placed vertically to the surface of the substrate was used as the milling tool, a horizontal end mill placed in parallel with the surface of the substrate may be used. Furthermore, the method of this invention may be used for replacing any resin encapsulated chip using any suitable resin such as novolak type epoxy resin, phenolic resin, polyurethane, and filled silicone.

According to this invention in which a part of the encapsulation resin and bump electrodes is intentionally left and used as the base for mounting a new chip, the chip can be replaced easily with minimum mechanical and chemical damage to the substrate. Especially when milling is used, the chip can be removed in a relatively short time, and this method can be used in any form of resin encapsulated chip. Also, by the use of the method in which the surface of the encapsulation resin and bump electrodes is planarized, the height of the bump electrodes left on the substrate can be made uniform, allowing reliable connection of the new chip. The use of low melting and high melting point solders ensures reliable chip connection. Furthermore, since the height of the bump electrodes increases to about 1.5 times that of conventional bump electrodes, the resistance to thermal stress is improved, and the replaced chip can easily be distinguished by the difference in height, thus facilitating subsequent maintenance and tests.

I claim:

1. An interconnect structure, comprising:

a first substrate with a surface;

a pattern of multiple conductive pads defining an area on the surface of the first substrate;

conductive bumps with first ends positioned on the conductive pads, and second ends of the bumps defined by a second surface approximately parallel to and above the surface of the first substrate and which defines the flat, distal ends of the bumps wherein the second surface is mountable to an electronic device having additional conductive bumps; and a first layer of an encapsulant filing around the bumps in the volume defined by the area of the pattern of conductive pads and between the first substrate surface and the defining second surface.

2. The structure of claim 1 in which the first ends of the solder bumps are approximately hemispherical.

3. The structure of claim 1 in which the conductive bumps include a high temperature solder; and which further comprises joints of low temperature solder connecting between the conductive pads and the first ends of the conductive bumps.

4. The structure of claim 1, in which the pads are copper and the conductive bumps are Pb rich with 3–5% Sn solder.

5. The structure of claim 1, in which the bumps are bonded to the pads by joints of approximately eutectic Pb/Sn solder.

6. The structure of claim 1, in which:

the pads are copper and at positions defined by a rectangular or square grid;

the interconnect structure includes an epoxy - fiberglass board;

the bumps are Pb rich solder with about 3–5% Sn;

the encapsulant includes epoxy, and further comprising:
   first joints of about eutectic Pb/Sn solder connecting between the conductive pads and the spherical ends of the solder bumps;

7. The structure of claim 1 in which the conductive bumps are of a different material than the conductive pads.

8. The structure of claim 1 in which the conductive bumps are a high melting temperature solder with a flat bottom which conforms to connects with the conductive pads and a shape indicating formation by reflow soldering directly to the pads.

9. An interconnect structure comprising:

a first substrate with a surface;

a pattern of multiple conductive pads defining an area on the surface of the first substrate;

conductive bumps with first ends positioned on the conductive pads, the bumps truncated by a surface approximately parallel to and above the surface of the first substrate surface and which defines the flat, distal ends of the bumps;

a first layer of an encapsulant filing around the bumps in the volume defined by the area of the pattern of conductive pads and between the first substrate surface and the truncating surface;

a second substrate having terminals projecting toward the first substrate with distal ends approximately touching the flat, distal ends of the bumps; and joints of a first material having a melting temperature below the glass transition temperature of the first layer of encapsulant and connecting between the distal ends of the terminals and the flat distal ends of the bumps.

10. The structure of claim 9 in which, the distal ends of the terminals are approximately hemispherical.

11. The structure of claim 9 further comprising:

a second layer of an encapsulant between the first layer of encapsulant and the substrate which seals around the terminals and bottom of the second substrate.

12. The structure of claim 9 in which the bumps and terminals have a melting temperature sufficiently above the melting temperature of the first material, for joining the terminals to the bumps without significantly changing the shape of the bumps and terminals.

13. The structure of claim 12 in which the bumps and terminals are a high melting temperature Pb rich solder with 3 to 5% Sn, and the first material is eutectic Pb/Sn based solder.

14. The structure of claim 9 in which the second substrate is an IC chip.

15. The structure of claim 9, in which the pads are copper and located at positions defined by a rectangular or square grid, the interconnect structure includes an epoxy - fiberglass board, the bumps are Pb rich solder with about 3–5% Sn, the encapsulant includes epoxy, and further comprising:

first joints of about eutectic Pb/Sn solder connecting between the conductive pads and the spherical ends of the solder bumps;

an IC chip having terminals of Pb rich solder with about 3–5% Sn projecting downward, with distal ends of terminals approximately touching the flat, distal ends of the solder bumps;

second joints of approximately eutectic Pb/Sn solder connecting between the distal ends of the solder terminals and the flat distal ends of the solder bumps; and a second layer of epoxy encapsulant between the first layer of encapsulant and the IC chip which seals around the solder terminals, second joints and bottom of the IC chip.

16. The structure of claim 9 in which both the conductive bumps and the terminals include a high temperature solder; and which further comprises joints of low temperature solder connecting between the conductive bumps and the distal ends of the terminals.

17. The structure of claim 9, in which the pads are copper and the conductive bumps are Pb rich with 3–5% Sn solder.

18. The structure of claim 9, in which the solder bumps are bonded to the copper pads by joints of approximately eutectic Pb/Sn solder.

19. The structure of claim 9 in which the conductive bumps are of a different material than the conductive pads.

20. An interconnect structure resulting from a method for replacing a substrate bonded to the interconnect structure by bump electrodes with the space between the substrate and the structure being filled with an encapsulant, comprising the steps of:

mechanically removing the substrate from the structure;

planarizing the surface of the encapsulant and the bump electrodes remaining on the structure, to form a surface of encapsulant with flat bump electrodes; and bonding another substrate to the planarized bump electrodes on the structure through the use of other bump electrodes.

21. The structure of claim 20, further comprising:

joints of low temperature solder connecting between distal ends of the other bump electrodes and the flat bump electrodes.

22. The structure of claim 20 in which, the distal ends of the other bump electrodes are approximately hemispherical.

23. The structure of claim 20 further comprising:

a second layer of encapsulant between the first layer of encapsulant and the substrate which seals around the other bump electrodes.

24. An interconnect structure resulting from a method for removing a substrate bonded to the interconnect structure by bump electrodes with the space between the bottom surface of said substrate and the structure being filled with an encapsulant, comprising the steps:

mechanically removing the substrate from the structure;

planarizing the exposed surface of the encapsulant and bump electrodes remaining on the surface of the structure, to form flat bump electrodes.

25. The structure of claim 24 in which:

the bump electrodes include a high melting temperature material;

the lower end of the bump electrodes are approximately hemispherical;

and in which the structure further comprises:

pads of a high melting temperature metal on the substrate surface;

a joining material connecting the bump electrodes to the pads, with a sufficiently low melting or transition temperature that the shapes of the pads and bump electrodes are not altered by their joining.

26. The structure of claim 24 which further comprises:

pads on the surface of the substrate to which the bump electrodes are joined;

and in which the bottoms of the bump electrodes conform to the pads.

27. A method of producing an interconnect structure, comprising the steps of:

mechanically removing a substrate bonded to the interconnect structure by first bump electrodes with a space between the structure and substrate being filled with an encapsulant; and planarizing the surface of the encapsulant and first bump electrodes remaining on the structure, to form flat bump electrodes.

28. The method claim 27 further comprising the step:

bonding another substrate to the planarized bump electrodes on the structure, through the use of second bump electrodes.

29. The method of claim 28 in which the step of bonding another substrate to the structure includes the steps of:

depositing a low temperature joining material between the first and the second bump electrodes which is wettable to both electrodes; and heating to join the first and second bump electrodes at a sufficiently low temperature that the bump electrodes are not melted.

30. The method of claim 29 in which the first and second bump electrodes are Pb rich solder with about 3 to 5% Sn;

distal ends of the second bump electrodes are about hemispherical; and the joining material is approximately eutectic Pb/Sn solder.

* * * * *